(12) United States Patent
Xu et al.

(10) Patent No.: US 10,153,279 B2
(45) Date of Patent: Dec. 11, 2018

(54) COMPACT AND RELIABLE CHANGEABLE NEGATIVE VOLTAGE TRANSMISSION CIRCUIT

(71) Applicant: GLOBALFOUNDRIES Singapore Pte. Ltd., Singapore (SG)

(72) Inventors: Fei Xu, Singapore (SG); Bai Yen Nguyen, Singapore (SG); Jinling Wang, Singapore (SG); Benjamin Shui Chor Lau, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 115 days.

(21) Appl. No.: 15/431,796

(22) Filed: Feb. 14, 2017

(65) Prior Publication Data

US 2017/0237428 A1 Aug. 17, 2017

Related U.S. Application Data

(60) Provisional application No. 62/295,151, filed on Feb. 15, 2016.

(51) Int. Cl.
| | |
|---|---|
| *H03K 3/356* | (2006.01) |
| *H01L 27/088* | (2006.01) |
| *H01L 27/092* | (2006.01) |
| *H01L 21/8234* | (2006.01) |
| *H01L 27/11546* | (2017.01) |

(52) U.S. Cl.
CPC ........ *H01L 27/092* (2013.01); *H01L 27/0883* (2013.01); *H03K 3/356182* (2013.01); *H01L 21/823493* (2013.01); *H01L 27/11546* (2013.01)

(58) Field of Classification Search
CPC . H01L 27/0688; H01L 27/11; H01L 27/1255; H01L 27/108; H01L 27/0251; H03L 17/063; H03L 19/017; H03L 5/19; H03L 7/08; H03L 5/08; H03L 5/13
USPC .......... 327/156, 157, 158; 375/371, 375, 376
See application file for complete search history.

(56) References Cited

U.S. PATENT DOCUMENTS

| | | | |
|---|---|---|---|
| 7,733,126 B1 * | 6/2010 | Choy | H03K 19/018521 326/68 |
| 8,461,899 B2 * | 6/2013 | Rana | H03K 3/356165 326/61 |

* cited by examiner

*Primary Examiner* — John W Poos
(74) *Attorney, Agent, or Firm* — Horizon IP PTE Ltd.

(57) ABSTRACT

A compact and reliable changeable negative voltage transmission circuit is described. It is very useful for applications need passing changeable negative voltage to selected pins in certain mode. The changeable negative voltage is 0V when enable signal EN is low and −V1 when enable signal EN is high. The circuit includes a control circuit and an output circuit. The control circuit includes a control high power source $V_{DD}$ and a control low power source $V_{NEG}$. The control circuit generates control output signals CON and CON_B to the output circuit to output either 0V if IN is low or −V1 if IN is high when EN is high. Only single type $V_T$ transistor is used in the transmission circuit without any reliability concern, no extra bias voltage is need, which reduces the area and keeps the manufacturing cost low.

20 Claims, 7 Drawing Sheets

| Terminals<br>Operations | CGL<br>Common | BL | | SL<br>Common | SG | | PW | |
|---|---|---|---|---|---|---|---|---|
| | | Sel | Unsel | | Sel | Unsel | Sel | Unsel |
| Program Mode | HV | HV | 0V | 0V | LV1 | 0V | -V1 | 0V |
| Erase Mode | 0V | HV | 0V | 0V | 0V | 0V | 0V | 0V |

COMPACT AND RELIABLE CHANGEABLE NEGATIVE VOLTAGE TRANSMISSION CIRCUIT

CROSS-REFERENCE TO RELATED APPLICATIONS

This application claims the priority of U.S. Provisional Application No. 62/295,151, entitled "A Single VT Transistor Solution for Passing Changeable Negative Voltage to Selected Pins of Memory Cell" filed on Feb. 15, 2016, which is herein incorporated by reference in its entirety.

BACKGROUND

In certain types of integrated circuits (ICs), changeable negative voltages may be employed. For example, certain types of functional circuits of the IC may require changeable negative voltages to improve their performance. However, conventional transmission circuits for passing a changeable negative voltage to the functional circuit require large area, may employ different type of $V_T$ transistors and may require extra bias or clamping voltages. For example, conventional driver circuits include a p-type metal oxide transistor and a n-type metal oxide transistor coupled in series between high and low power sources. Such conventional driver circuits require large layout area especially when the design needs to have deep n-type well.

In addition, the control signal used as an input of the driver circuit is very difficult to define the voltage level. The potential difference between high power source and the negative voltage is much larger than the normal device working range, it creates reliability problems for conventional driver circuits. For example, in a conventional driver circuit for passing the negative changeable voltage has $V_{DD}$, such as 5V, as the high power source and the negative changeable voltage as its low power source. In such case, the p-type transistor and the n-type transistor both have reliability issues due to the negative voltage low power source. However, if $V_{SS}$ or 0V is used as the high power source, the circuit would not function when the changeable negative voltage is 0V.

The disclosure is directed to a compact and reliable changeable negative voltage transmission circuit for supplying a changeable negative voltage to a functional circuit of an integrated circuit.

SUMMARY

Embodiments of the present disclosure generally relate to semiconductor devices. In one embodiment, a circuit for passing a changeable negative voltage ($V_{NEG}$) is disclosed. The $V_{NEG}$ has a negative high state=-V1 and a negative low state=0V. A control circuit block is disposed between control high and control low power sources, which the control low power source is $V_{NEG}$. The control circuit block is configured to receive an enable signal EN and an input signal IN. Enable signal EN includes an enable high state and an enable low state. When EN is in the enable high state, $V_{NEG}$=-V1. When EN is in the enable low state, $V_{NEG}$=0V. The input signal IN includes an input high state and an input low state. The control circuit block is further configured to generate first output control signal CON and second output control signal CON_B in response to input signal IN. The transistors in the control circuit block are the same gate threshold ($V_T$) type transistors. A control circuit block is disposed between control high and control low power sources. The output driver circuit is configured to receive the CON and CON_B signals from the control circuit block. The output driver circuit is further configured to generate an output signal OUT. OUT=0V when IN is in the input low state; OUT=-V1 when IN is in the input high state and EN is in the enable high state; and OUT=0V when EN is in the enable low state.

In another embodiment, an output driver circuit for passing a changeable negative voltage is described. The output driver circuit includes a high power source and a low power source. The high power source is $V_{SS}$ which=0V. The low power source includes a changeable negative voltage $V_{NEG}$, which $V_{NEG}$=0V when an enable signal EN is in an enable low state and $V_{NEG}$=-V1 when an enable signal EN is in an enable high state. The output driver circuit further includes first and second metal oxide semiconductor transistors. The transistors are coupled in series between high and low power sources and are the same gate threshold ($V_T$) type transistors. The output driver circuit further includes a first input, a second input and an output. The first input is coupled to a first gate of the first transistor and is configured to receive a first control signal CON_B. The second input is coupled to a second gate of the second transistor and is configured to receive a second control signal CON. CON and CON_B are complementary signals. The output is commonly coupled to the first and second transistors and is configured to generate an output signal OUT in response to the first and second input signals CON_B and CON. OUT=-V1 when CON=a second control high state, CON_B=-V1 and EN=enable high state, otherwise, OUT=0V.

In yet another embodiment, a method for passing a negative changeable voltage $V_{NEG}$ is disclosed. The method includes providing the negative changeable voltage which $V_{NEG}$ has a negative high state=-V1 and a negative low state=0V. An enable signal EN is provided to a control circuit block. The enable signal EN has an enable high state ($V_{NEG}$=-V1) and an enable low state ($V_{NEG}$=0V). An input signal IN having an input high state and an input low state is provided to the control circuit block. Control output signals CON and CON_B are generated to an output circuit block in response to the input signal IN. An output signal is generated in response to CON and CON_B. OUT=0V when IN is in the input low state and EN is in the enable high state; OUT=-V1 when IN is in the input high state and EN is in the enable high state; and OUT=0V when EN is in the enable low state.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 2b shows an exemplary table containing biasing conditions for the device of FIG. 2a;

DETAILED DESCRIPTION

Embodiments generally relate to semiconductor devices or integrated circuits (ICs). The devices or ICs can be incorporated into or used with, for example, consumer electronic products, particularly portable consumer products, such as cell phones, laptop computers and personal digital assistants (PDAs).

The fabrication of devices may involve the formation of features on a substrate that make up circuit components, such as transistors, resistors and capacitors. The devices are interconnected, enabling the ICs to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
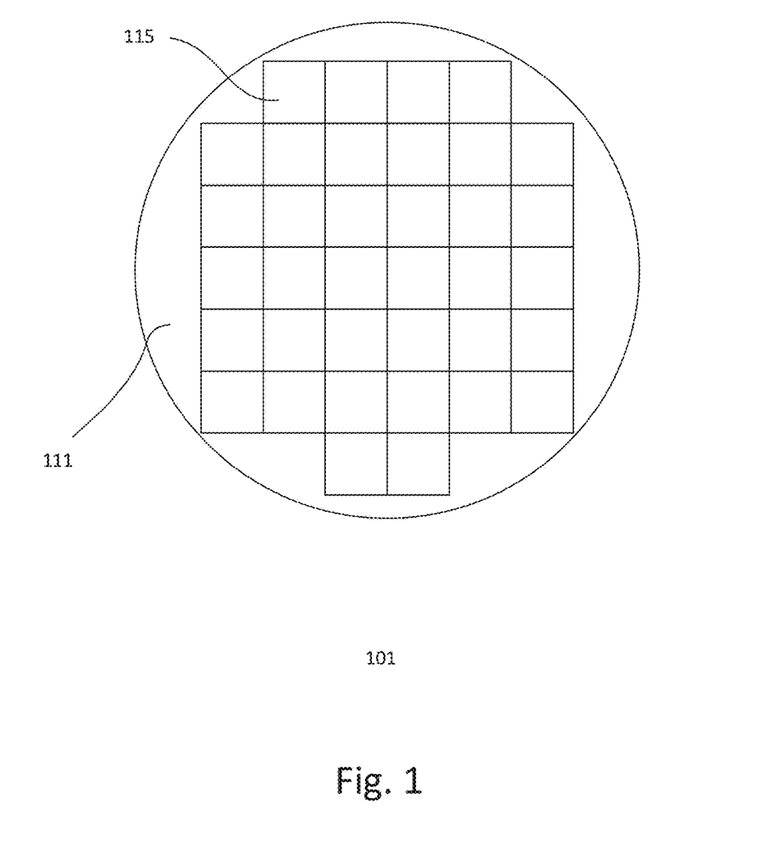
FIG. 1 shows a simplified plan view of an embodiment of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped wafers with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Wafer dicing process is then performed. When the process is completed, the wafer is diced along the dicing channels to singulate the devices into individual chips.

Figure 2A:
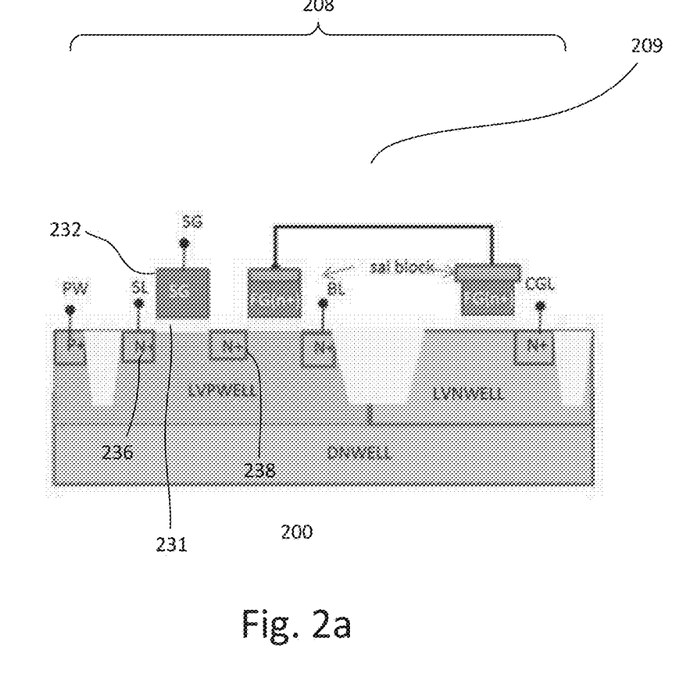
FIG. 2a shows an exemplary application of a device for receiving a negative voltage from a negative voltage transmission circuit.

FIG. 2a shows a cross-sectional view of an application of a device 200 which includes a functional circuit receiving a changeable negative voltage. The device includes a substrate. The device, for example, may be a part of the wafer, as described in FIG. 1. Common elements may not be described or described in detail. The substrate, for example, may be a semiconductor substrate, such as a silicon substrate. Other types of substrates or wafers may also be useful. The device may include doped regions having different dopant concentrations. For example, the device may include heavily doped ($x^+$), intermediately doped (x) and lightly doped ($x^-$) regions, where x is the polarity type which can be p or n.

The substrate of the device, as shown, includes a device region 208. The device region may include a functional circuit or device component which receives a changeable negative voltage. In one embodiment, the device region is a memory cell region with a memory cell 209. The memory cell may be a non-volatile memory (NVM) cell. Other types of device components which employs or utilizes a changeable negative voltage may also be useful.

Although the memory cell region is shown with one memory cell, it is understood that the cell region may include numerous memory cells interconnected to form a memory array. In addition, the device may include other device regions, such as low voltage (LV) device regions, medium voltage (MV) device regions and high voltage (HV) device regions.

As shown, the device region includes first and second device wells. The first device well is a low voltage p-well (LVPWELL) and the second device well is a low voltage n-well (LVNWELL). A deep n-type well (DNWELL) may be provided. The DNWELL extends below the LVPWELL and LVNWELL.

The memory cell includes a select gate (SG) and a first floating gate (FG) disposed on the substrate over the LVPWELL. A gate includes a gate electrode 232 over a gate dielectric 231. As shown, the FG electrode is heavily doped with n-type dopants ($n^+$ doped). Adjacent to the SG and FG are $n^+$ doped first and second S/D regions 236 and 238. The SG and first and second S/D regions of the SG form a select transistor. As shown, the second S/D region of the FG and the first S/D region of the SG form a common S/D region. In one embodiment, a second FG is disposed over the LVNWELL. The FG electrode is a $n^+$ doped FG electrode. The second FG gate includes a $n^+$ S/D region disposed in the LVNWELL adjacent to the second FG. The LVPWELL includes a $p^+$ doped region which serves as a contact (PW) to the LVPWELL.

The various components may serve as memory cell terminals. In one embodiment, the SG serves as SG terminal, the first S/D region of the SG serves as a source line (SL) terminal cell and the second S/D region of the first FG serves as a bitline (BL) terminal. The first S/D region of the second FG serves as a control gate line (CGL) terminal. The PW contact is a PW terminal for biasing the LVPWELL.

Figure 2B:
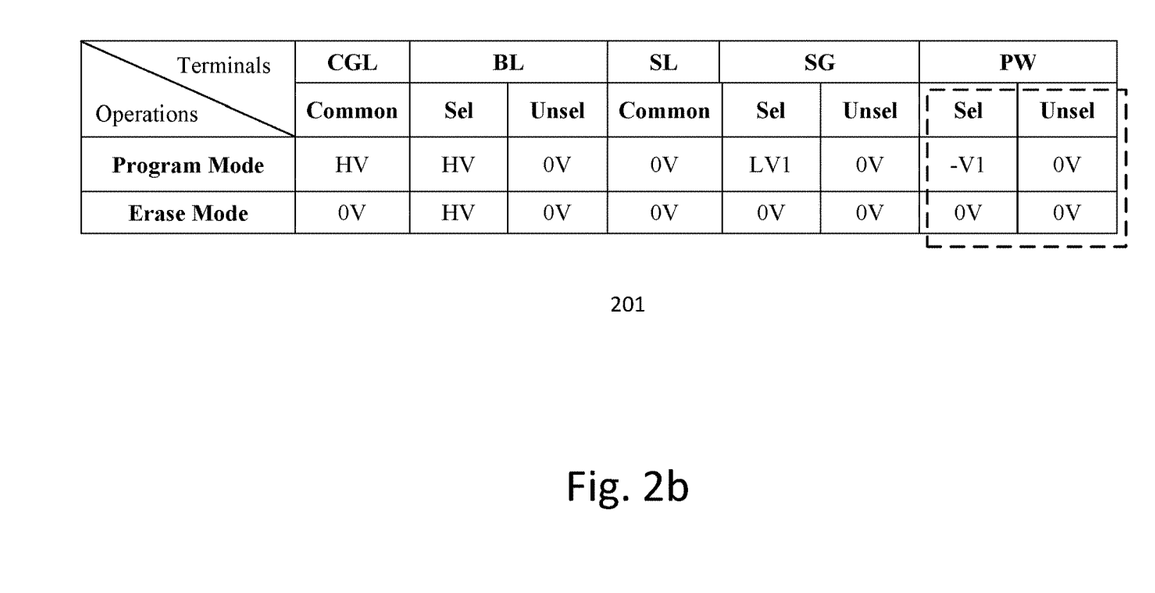

FIG. 2b shows a table 201 containing bias or operating voltages for program and erase operations for different memory cell terminals. As shown, the PW is biased with a negative voltage −V1 during a program operation and 0V during an erase operation for the selected cell. To one PW terminal, the bias is a changeable negative voltage. The negative voltage −V1 may be, for example, −3V. Other negative voltages for −V1 may also be useful.

Figure 3:
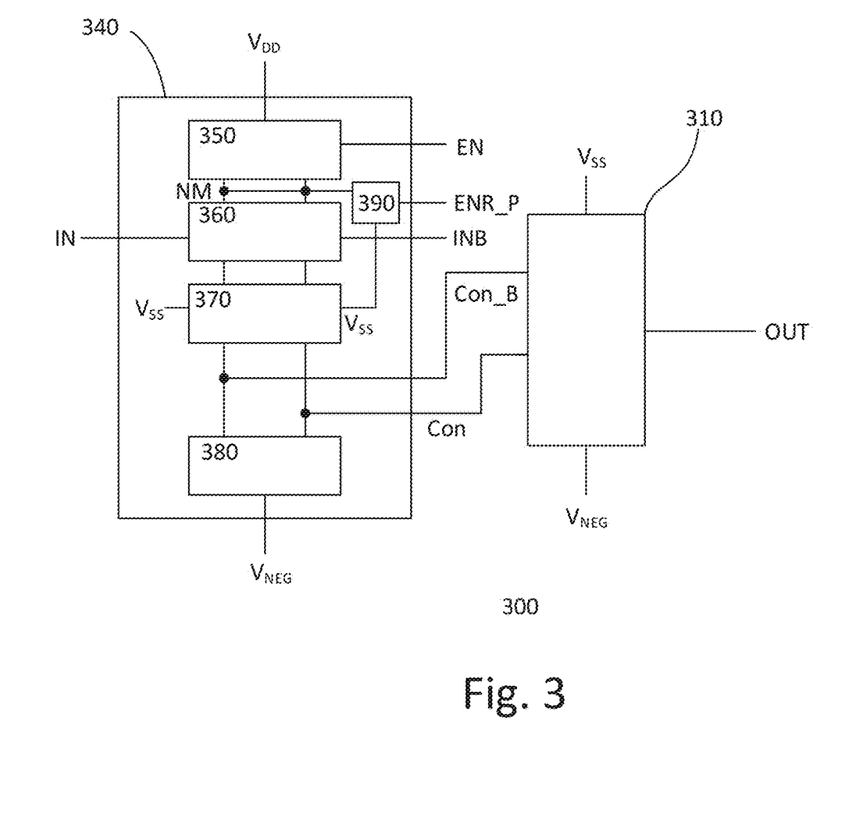
FIG. 3 shows simplified block diagram of an embodiment of a changeable negative voltage transmission circuit.

FIG. 3 shows a simplified block diagram of an embodiment of a negative voltage transmission circuit 300. The transmission circuit transmits a changeable negative voltage. In one embodiment, the transmission circuit includes a control block or circuit 340 and an output block or circuit 310. The control block, in one embodiment, is a level shifter circuit. Other types of control blocks may also be useful. The control block includes various sub-blocks coupled in series between a first power source and a second power source. In one embodiment, the first power source is $V_{DD}$ or operating voltage of the device and the second power source is $V_{NEG}$, which is a changeable negative voltage or power source. The changeable negative voltage $V_{NEG}$ may be changed between two states, a negative low state and a negative high state. In one embodiment, the negative high state is −V1 and the negative low state is 0V ($V_{SS}$). In one embodiment, −V1=−3V. Providing $V_{NEG}$ with other negative voltages for −V1 may also be useful. As for $V_{DD}$, it may be about 5V. Providing other $V_{DD}$ may also be useful.

As shown, the control block includes an enable sub-block 350, an input or select sub-block 360, a reset sub-block 390, a clamp sub-block 370 and a pull-down sub-block 380. The enable sub-block is coupled to the first power source and receives an enable signal EN. In one embodiment, EN includes a first state and a second state. For example, the EN includes an active enable state and an inactive enable state. In one embodiment, the active EN is a logic 1 signal and the inactive state is logic 0 signal. For example, the active EN signal=$V_{DD}$ (5V) and the inactive EN=$V_{SS}$ (0V). The enable signal EN and $V_{NEG}$ are correlated. In one embodiment, when EN is active, such as 5V, then $V_{NEG}$=−V1. On the other hand, when EN is inactive, such as 0V, $V_{NEG}$=0V.

The input or select sub-block is coupled in series with the enable sub-block and receives input or select signals. The select signals are IN and its complement INB. The select signals IN and INB have active and inactive states. In one embodiment, an active IN signal is a logic 1 signal, such as $V_{DD}$ (5V) and an inactive IN signal is a logic 0 signal, such as $V_{SS}$ (0V). As for INB, an active INB signal is a logic 0 signal and an inactive INB signal is a logic 1 signal, such as $V_{DD}$. Either active select signals IN and INB are input to the select sub-block or inactive select signals IN and INB is input to the select sub-block. For example, the sub-block receives active IN and INB signals or the sub-block receives inactive IN and INB signals. The node between the input and enable sub-block is node NM. When EN is active, which means the second power source $V_{NEG}$ is at negative high state, the voltage at NM ($V_{NM}$) is less than $V_{DD}$ due to a voltage drop of at least one transistor gate threshold voltage ($V_T$). For example, $V_{NM}$=$V_{DD}$−$V_T$. Typically, the voltage drop caused by $V_T$ is 0.7V. As such, $V_{NM}$=$V_{DD}$−0.7V. Additional transistors may be provided to provide a smaller $V_{NM}$. For example, $V_{NM}$=$V_{DD}$−N*$V_T$. In one embodiment, $V_{NM}$+V1<$V_{DD}$. When EN is inactive, which means the second power source $V_{NEG}$ is at negative low state, the voltage at NM ($V_{NM}$) is equal to $V_{DD}$.

The clamp sub-block is coupled in series with the input sub-block while the pull-down sub-block is disposed in series with the clamp sub-block and is coupled to $V_{NEG}$. Between the input sub-block and clamp sub-block are first and second nodes NA and NB. In one embodiment, the clamp sub-block maintains the voltage at both NA and NB to be higher than $V_{SS}$ (0V). This avoids reliability issues with transistors of the various sub-blocks, such as the enable, input and reset sub-blocks.

Between the clamp sub-block and the pull-down sub-block are first and second output nodes NOA and NOB. In one embodiment, output signals of the control block, CON_B and CON, are coupled to NOA and NOB. For example, CON_B is coupled to NOA and CON is coupled to NOB. The two control block output signals, CON and CON_B, are complementary signals.

As for the pull-down sub-block is configured to pull down CON or CON_B signal to $V_{NEG}$, depending on IN. For example, CON is pull down to $V_{NEG}$ when IN is inactive (IN=0V) or CON=$V_{MN}$ when IN is active (IN=$V_{DD}$). On the other hand, CON_B is pulled down to $V_{NEG}$ when IN=active or CON_B=$V_{NM}$ when IN is inactive.

The reset sub-block is configured to receive an enable reset pulse ENR_P. When the pulse is received, the reset sub-block pulls down node NM from $V_{DD}$. In one embodiment, the sub-block creates a path between $V_{DD}$ to $V_{SS}$ as a result of ENR_P. This can eliminate the unwanted steady state of NM node.

The output block, in one embodiment, is a switch circuit. The switch circuit is coupled between first and second output power sources. In one embodiment, the first power source is $V_{SS}$ and the second power source is the changeable negative voltage source $V_{NEG}$. In one embodiment, switch circuit employs one type of $V_T$ transistors only. The switch circuit is controlled by the control block output signals CON and CON_B and generates an output signal OUT in response. In one embodiment, the switch circuit is configured to generate OUT=0V when IN is inactive (IN=0V) and EN is active (EN=$V_{DD}$). In the case where IN is active (IN=$V_{DD}$) and EN is active (EN=$V_{DD}$), OUT=−V1. In the case EN is inactive (EN=0V), OUT=0V.

Figure 4A:
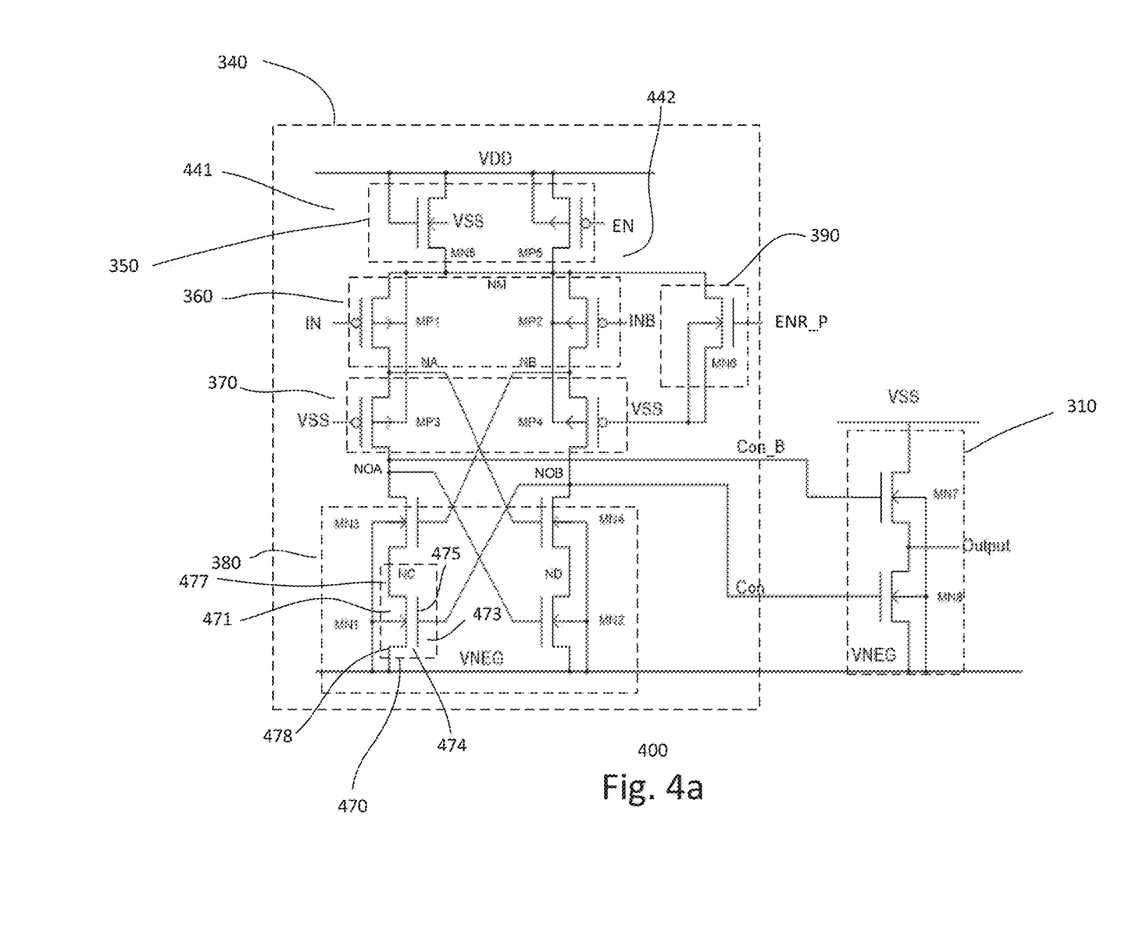
FIG. 4a shows a schematic diagram of an embodiment of a changeable negative voltage transmission circuit.

FIG. 4*a* shows a schematic diagram of an embodiment of a changeable negative voltage transmission circuit 400. The transmission circuit is similar to that described in FIG. 3. Common elements may not be described or described in detail. The transmission circuit transmits a changeable negative voltage. In one embodiment, the transmission circuit includes a control block or circuit 340 and an output block or circuit 310.

The control block, in one embodiment, is a level shifter circuit. Other types of control blocks may also be useful. The control block includes first and second paths 441 and 442 coupled between $V_{DD}$ and $V_{NEG}$. The first path may be referred to as the left path and the second path may be referred to as the right path. The first path includes a plurality of transistors coupled in series between $V_{DD}$ and $V_{NEG}$; the second path includes a plurality of transistors coupled in series $V_{DD}$ and $V_{NEG}$. The changeable negative voltage $V_{NEG}$ may be changed between two states, 0V or −V1 while $V_{DD}$ may be about 5V. In one embodiment, −V1 is about −3V. Other voltages for $V_{NEG}$ and $V_{DD}$ may also be useful.

A transistor 470 may be a metal oxide semiconductor (MOS) transistor. The MOS transistor includes a gate 473 between first and second S/D terminals 477 and 478. The gate is disposed on a substrate which may include a gate electrode 475 disposed over a gate dielectric 474. As for the S/D terminals, they may be heavily doped regions in a transistor well in the substrate. The transistor well serves as a body 471 of the transistor in the substrate. A transistor may be a p-type or a n-type transistor. For a p-type transistor, the transistor well is n-type while the S/D regions are p-type; for a n-type transistor, the transistor well is p-type while the S/D regions are n-type. A p-type transistor is designated as MPx and a n-type transistor is designated as MNx.

As shown, transistors which are in series have first and second S/D terminals which form a common S/D terminal. For example, a first S/D terminal of one transistor is coupled to a second S/D terminal of another transistor. The first S/D terminal of the first transistor in a path is coupled to $V_{DD}$ and the second S/D terminal of the last transistor in a path is coupled to $V_{NEG}$.

In one embodiment, the first path and second path of the input sub-block, clamp sub-block and pull-down sub-block each includes the same number of transistors coupled in series. The fist path and second path of enable sub-block each includes the same number of transistors or can be with different number of transistors. As shown, the first path, from $V_{DD}$ to $V_{NEG}$, includes transistors MN5, MP1, MP3, MN3 and MN1 coupled in series. The second path, from $V_{DD}$ to $V_{NEG}$, includes transistors MP5, MP2, MP4, MN4 and MN2 coupled in series.

In one embodiment, the second terminals of MN5 and MP5 are coupled to first terminals of MP1 and MP2. This common connection form node NM. The second terminal of MP1 and the first terminal of MP3 form node NA. The second terminal of MP2 and the first terminal of MP4 form node NB. The second terminal of MP3 and the first terminal of MN3 form output node NOA. The second terminal of MP4 and the first terminal of MN4 form output node NOB. The node NA is coupled to the gate of MN4 while the node NB is coupled to gate of MN3. The node NOA is coupled to the gate of MN2 while the node NOB is coupled to gate of MN1. The second terminal of MN3 and the first terminal of MN1 form node NC; the second terminal of MN4 and the first terminal of MN2 form node ND.

An enable reset transistor MN6 is provided for the control block. The first terminal of the enable reset transistor is coupled to node NM and the second terminal of the enable reset transistor is coupled to the gate of MP4. The various transistors of the control block have their body biased. In one embodiment, MN5 is biased with $V_{SS}$, the body of MP5 is biased with $V_{DD}$, the bodies of MP1, MP2, MP3 and MP4 are biased with the voltage at node NM ($V_{NM}$). As for MN1, MN2, MN3 and MN4, their bodies are biased with $V_{NEG}$. The body and second terminal of MN6 are biased with $V_{SS}$.

The various transistors are provided for the sub-blocks of the control block. In one embodiment, transistors MN5 and MP5 are provided for the enable sub-block 350. The gate of transistor MN5 is coupled to $V_{DD}$ and the gate of transistor MP5 receives EN. The transistors MP1 and MP2 form the input or select sub-block 360. The gate of transistor MP1 receives IN and the gate of transistor MP2 receives INB. The transistors MP3 and MP4 form the clamp sub-block 370. The gates of transistors MP3 and MP4 are biased at $V_{SS}$. The transistors MN1, MN2, MN3 and MN4 form the pull-down sub-block 380 and enable reset transistor MN6 form the reset sub-block 390. Output signal CON is coupled to node NOB and output signal CON_B is coupled to node NOA.

As for the output block, it includes transistors MN7 and MN8 coupled in series between $V_{SS}$ and $V_{NEG}$. For example, the output block includes first and second n-type transistors coupled in series between $V_{SS}$ and $V_{NEG}$. The output signal OUT is generated at OUT terminal disposed between the second terminal of transistor MN7 and first terminal of transistor MN8. The output signal OUT is generated in response to input signals CON and CON_B signals of the output block from the control block.

Figure 4B:
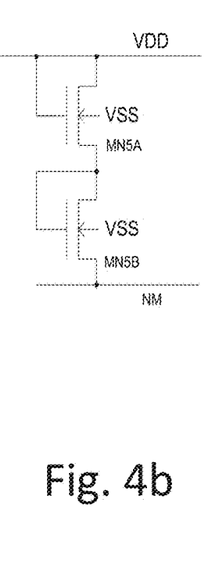
FIG. 4b shows a schematic diagram of another embodiment of a changeable negative voltage transmission circuit.

As previously discussed, $V_{NM}$ may be reduced by providing transistor MN5 with additional voltage drops created by additional series transistors. As shown in FIG. 4b, transistor MN5 is configured to have first and second series transistors MN5A and MN5B. This increases the voltage drop from $V_{DD}$ to $2*V_T$, i.e., $V_T$ is the threshold voltage of each transistor. Larger voltage drops may be created by providing additional transistors. For example, $V_{NM}=V_{DD}-N*V_T$, where N is the number of series transistors of MN5. In one embodiment, $V_{NM}+V1<V_{DD}$.

Referring back to FIG. 4a, the clamp sub-block is coupled in series with the input sub-block while the pull-down sub-block is disposed in series with the clamp sub-block, which is coupled in series to $V_{NEG}$. In one embodiment, the clamp sub-block maintains node NA and NB to be above $V_{SS}$. This reduces reliability issues with the various transistors of the input enable and reset sub-blocks. Between the clamp sub-block and the pull-down sub-block are output signals of the control block, CON_B and CON coupled to nodes NOA and NOB. The two control block output signals, CON and CON_B, are complementary signals.

In one embodiment, the various transistors of the transmission circuit are all the same $V_T$ type. For example, the transistors of the control block and output block are of the same $V_T$ type. Providing transistors which are the same $V_T$ type facilitates a compact design and minimum mask layer requested, both of which reduce manufacturing costs.

Figure 5:
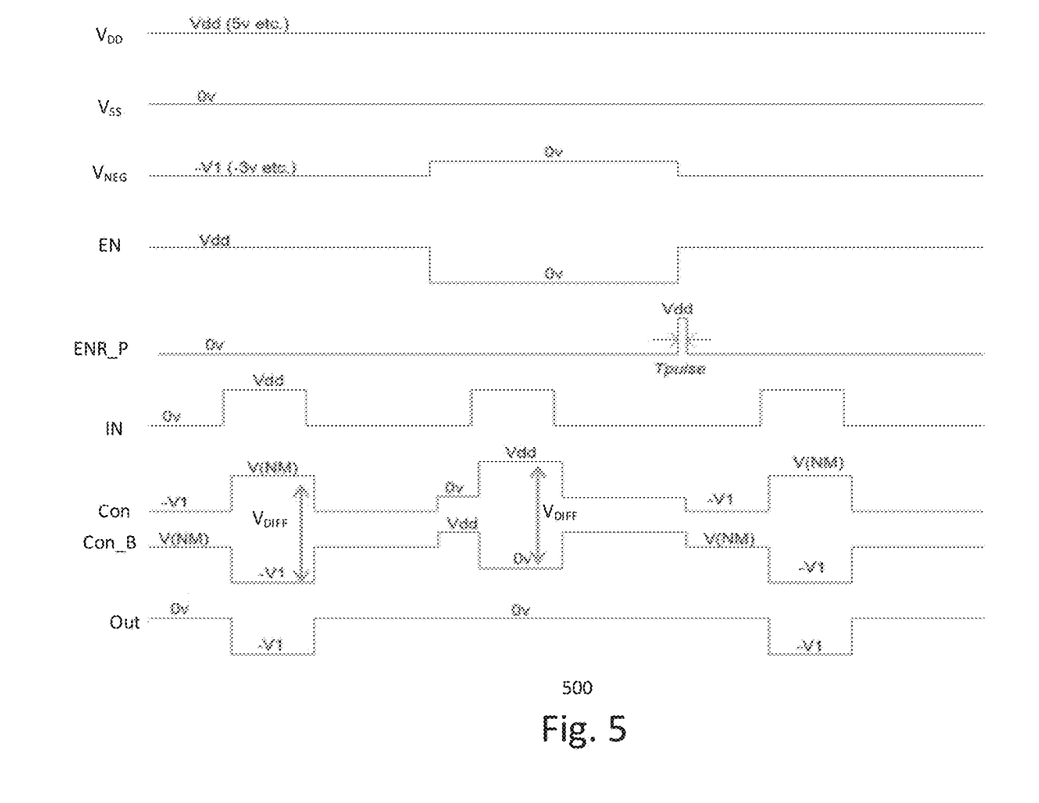
FIG. 5 shows a timing diagram of the changeable negative voltage transmission circuit.

FIG. 5 shows the timing diagram 500 of the transmission circuit. As shown, $V_{DD}$ is 5V and $V_{SS}$ is 0V. As for $V_{NEG}$, it switches between 0V or –V1 (e.g., –3V). Other voltage values for $V_{DD}$ and $V_{NEG}$ may also be useful. The EN signal and the changeable $V_{NEG}$ are related. In one embodiment, when $V_{NEG}$ is equal to –V1, EN=$V_{DD}$ (active); when $V_{NEG}$ is equal to 0V, EN=0V (inactive). When the EN signal is active and the IN signal is inactive (e.g., 0V), CON is equal to –V1 and CON_B=0V. This causes the OUT signal to equal to 0V. On the other hand, when the IN signal is active (e.g., $V_{DD}$), CON is equal to $V_{NM}$ and CON_B=–V1. This causes the OUT signal to equal to –V1. As shown, the voltage difference between $V_{NM}$ and –V1 is equal to $V_{DIFF}$.

In the case EN signal is inactive and $V_{NEG}$ is at negative low state 0V, the output block is inactive (OUT=0V). However, when the EN signal is inactive, an active IN signal may be received. An inactive EN may cause the CON signal to be elevated from –V1 to 0V and the CON_B signal to be elevated from $V_{NM}$ to $V_{DD}$. The voltage difference between the CON and CON_B signals is equal to $V_{DIFF}$. A reset pulse ENR_P is generated when ENB goes active again. The reset pulse resets the control block. For example, the reset pulse resets the internal nodes of the control circuit, such as NM, NA, NB, NOA and NOB, so that CON and CON_B can go to the desired voltage level. In one embodiment, the ENR_P is about 1 ns. Providing pulses of other widths may also be useful. Resetting the CON and CON_B signals to the state prior to an active IN signal when EN signal is inactive enables the circuit to operate as normal. Otherwise, the NM node will be kept at $V_{DD}$ until the next IN signal transition edge.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A circuit for passing a negative changeable voltage ($V_{NEG}$) comprising:
    the negative voltage $V_{NEG}$ has a negative high state=–V1 and a negative low state=10V;
    a control circuit block disposed between control high and control low power sources, the control low power source is $V_{NEG}$, wherein
        the control circuit block is configured to receive
            an enable signal EN having an enable active state and an enable inactive state, wherein $V_{NEG}$ is equal to –V1 when EN is is active and $V_{NEG}$=0V when EN is inactive, and
            an input signal IN having an input active state and an input inactive state, and
        the control circuit block is configured to generate first and second output control signals CON and CON_B in response to IN; and
    an output circuit block disposed between output high and output low power sources, wherein
        the output circuit block is configured to receive the CON and CON_B signals from the control circuit block, and the output circuit block is configured to generate an output signal OUT, wherein
OUT=0V when IN is inactive and EN is active,
OUT=−V1 when IN is active and EN is active, and
OUT=0V when EN is inactive.

2. The circuit of claim 1 wherein:
the active EN=logic 1; and
the inactive EN=logic 0.

3. The circuit of claim 1 wherein −V1=−3V.

4. The circuit of claim 1 wherein:
CON and CON_B are complementary signals;
CON and CON_B have
 a first control high state=$V_{DD}$,
 a second control high state <$V_{DD}$,
 a first control low state=0V, and
 a second control low state=−V1;
CON is either in the second control high state or the second control low state in response to IN when EN is in the enable high state;
CON_B is either in the second control low state or the second control high state in response to IN when EN is in the enable high state;
CON is either in the first control high state or the first control low state in response to IN when EN is in the enable low state; and
CON_B is either in the first control low state or the first control high state in response to IN when EN is in the enable low state.

5. The circuit of claim 4 wherein the control block comprises a reset circuit, the reset circuit is configured to generate a reset pulse ENR_P when EN switches from the inactive enable state to active enable state, wherein the pulse causes
CON to be go from the first control high/low state to the second control high/low state; and
CON_B to be go from the first control low/high state to the second control low/high state.

6. The circuit of claim 1 wherein the control block comprises a level shifter.

7. The circuit of claim 1 wherein the control block comprises:
an enable sub-block coupled in series to the control high power source, the enable sub-block is configured to receive the EN signal;
an input sub-block coupled in series to the enable sub-block, wherein the coupling between the enable and input sub-blocks forms a node NM, the input sub-block is configured to receive IN and a complementary input signal INB, wherein IN and INB are complementary signals;
a clamp sub-block in series to the input sub-block;
a pull-down sub-block coupled in series between the claim sub-block and the control low power source, the pull-down sub-block is configured to pull down CON or CON_B signal to $V_{NEG}$, depending on IN;
first and second control outputs are configured to provide output control signals CON and CON_B signals, the first and second control output s are coupled between the clamp and pull-down sub-blocks, the clamp sub-block maintains NA and NB to be higher than $V_{SS}$ (0V), wherein maintaining NA and NB higher than $V_{SS}$ avoids reliability issues with transistors of the various sub-blocks, including the enable, input and reset sub-blocks; and
a reset sub-block, the reset sub-block have a first reset coupled between the enable and input sub-blocks and a second reset coupled to the clamp sub-block, the reset circuit is configured to reset the control block when EN goes from the enable low state to the enable high state, wherein the pulse causes
CON to be go from the first control high/low state to the second control high/low state; and
CON_B to be go from the first control low/high state to the second control low/high state.

8. The circuit of claim 7 wherein $V_{NM}$<$V_{DD}$.

9. The circuit of claim 7 wherein the sub-blocks which are coupled in series between the high and low control power sources and form first and second current paths between the high and low control power sources.

10. The circuit of claim 1 wherein the control block comprises:
a plurality of transistors coupled in series between high and low control power sources;
first and second current paths formed by the plurality of transistors coupled in series between the high and low control power sources;
wherein the plurality of transistors comprise p-type and n-type transistors;
wherein each transistor of the plurality of transistors comprises a gate between first and second S/D s and a body; and
wherein the transistors form sub-blocks of the control block which include
 an enable sub-block,
 an input sub-block,
 a clamp sub-block,
 a pull-down sub-block, and
 a reset sub-block.

11. The circuit of claim 10 wherein:
the output block includes transistors; and
the transistors of the control block and the transistors of the output block are all the same gate threshold voltage ($V_T$) type transistors.

12. The circuit of claim 10 wherein:
the first current path between the high and low control power source comprises
 an n-type transistor MN5 having a first S/D terminal of MN5 coupled to the control high power source,
 a p-type transistor MP1 having a first S/D terminal of MP1 coupled to a second S/D terminal of MN5,
 a p-type transistor MP3 having a first S/D terminal of MP3 coupled to a second S/D terminal of MP1, wherein the first S/D terminal of MP3 and the second S/D terminal of MP1 from a node NA,
 a n-type transistor MN3 having a first S/D terminal of MN3 coupled to a second S/D terminal of MP3, and
 a n-type transistor MN1 having a first S/D terminal of MN1 coupled to a second S/D terminal of MN3 and a second S/D terminal of MN1 is coupled to the low control power source;
the second current path between the high and low control power source comprises
 a p-type transistor MP5 having a first S/D terminal of MP5 coupled to the control high power source,
 a p-type transistor MP2 having a first S/D terminal of MP2 coupled to a second S/D terminal of MP5,
 a p-type transistor MP4 having a first S/D terminal of MP4 coupled to a second S/D terminal of MP2, wherein the first S/D terminal of MP4 and the second S/D terminal of MP2 from a node NB,
 a n-type transistor MN4 having a first S/D terminal of MN4 coupled to a second S/D terminal of MP4, and
 a n-type transistor MN2 having a first S/D terminal of MN2 coupled to a second S/D terminal of MN4 and a second S/D terminal of MN2 is coupled to the low control power source; and a n-type transistor MN6, wherein
  a first S/D terminal of MN6 is commonly coupled to the second S/D terminals of MN5 and MP5 and first S/D terminals of MP1 and MP2 to form node NM, and
  a second S/D terminal of MN6 is coupled to a gate terminal of MP4, the second S/D terminal is commonly coupled to a body terminal of MN6 which is coupled to 0V.

13. The circuit of claim 12 wherein:
MN5 and MP5 forms the enable sub-block in which
  a gate terminal of MN5 is coupled to the control high power source,
  a body terminal of MN5 is coupled to 0V,
  a gate of MP5 is configured to receive EN, and
  a body terminal of MP5 is coupled to the control high power source;
MP1 and MP2 forms the input sub-block in which
  a gate terminal of MP1 is configured to receive IN,
  a body terminal of MP1 is coupled to node NM,
  a gate terminal of MP2 is configured to receive INB which is a complement of IN, and
  a body terminal of MP2 is coupled to node NM;
MP3 and MP4 forms the clamp sub-block in which
  a gate terminal of MP3 is coupled to 0V,
  a body terminal of MP3 is coupled to node NM,
  a gate terminal of MP4 is coupled to the second S/D terminal of MN6, which is coupled to 0V, and
  a body terminal of MP4 is coupled to node NM;
MN6 forms the reset sub-block in which a gate terminal of MN6 is configured to receive a reset pulse ENR_P; and
MN1, MN2, MN3 and MN4 form the pull down sub-block in which
  a gate terminal of MN3 is coupled to node NB,
  a body terminal of MN3 is coupled to the control low power source,
  a gate terminal of MN1 is coupled to a first output terminal configured to generate CON,
  a body terminal of MN1 is coupled to the control low power source,
  a gate terminal of MN4 is coupled to node NA,
  a body terminal of MN4 is coupled to the control low power source,
  a gate terminal of MN2 is coupled to a second output terminal configured to generate CON_B, and
  a body terminal of MN2 is coupled to the control low power source.

14. The circuit of claim 13 wherein transistor MN5 of the enable sub-block comprises N number of n-type transistors coupled in series between the high power source and node NM, wherein $V_{NM}$=the control high voltage source$-(N*V_T)$, where $V_T$ is the gate threshold voltage of one of the N n-type transistors.

15. The circuit of claim 14 wherein $V_{NM}+V1<V_{DD}$.

16. An output driver circuit for passing a changeable negative voltage comprising:
  first and second metal oxide semiconductor transistors coupled in series, wherein the first and second transistors are the same gate threshold voltage ($V_T$) type transistors;
  a high power source, wherein the high power source is $V_{SS}$, which=0V;
  a low power source, wherein the low power source comprises a changeable negative voltage $V_{NEG}$, wherein $V_{NEG}$=0V when an enable signal EN is in an enable inactive state and $V_{NEG}$=−V1 when EN is in an enable active state;
  wherein the first and second transistors are coupled in series between the high and low power sources;
  a first input coupled to a first gate of the first transistor, the first input is configured to receive a first control signal CON_B;
  a second input coupled to a second gate of the second transistor, the second input is configured to receive a second control signal CON, wherein CON and CON_B are complementary signals; and
  an output commonly coupled to the first and second transistors, wherein the output is configured to generate an output signal OUT in response to the first and second input signals CON_B and CON, wherein
    OUT=0V when
      CON=−V1,
      CON_B=a second control high state, and
      EN=enable active state, and
    OUT=−V1 when
      CON =a second control high state,
      CON_B=−V1, and
      EN=enable active state.

17. The output driver of claim 16 wherein OUT=0V when EN=enable inactive state.

18. The output driver of claim 16 the first and second transistors are n-type transistors.

19. A method for passing a negative changeable voltage ($V_{NEG}$) comprising:
  providing the changeable negative voltage $V_{NEG}$, wherein $V_{NEG}$ has a negative high state=−V1 and a negative low state=0V;
  providing an enable signal EN to a control circuit block, wherein EN has an enable active state and an enable inactive state, wherein $V_{NEG}$ is equal to −V1 when EN is in the enable active state and $V_{NEG}$=0V when EN is in the enable inactive state;
  providing a select signal IN to the control circuit block, the having an select active state and an select inactive state,
  generating control output signals CON and CON_B to an output circuit block, in response to IN; and
  generating an output signal OUT in response to CON and CON_B, wherein
    OUT=0V when IN is in the select inactive state and EN is in the enable active state,
    OUT=−V1 when IN is in the select active high state and EN is in the enable active state, and
    OUT=0V when EN is in the enable inactive state.

20. The method of claim 18 comprises providing a control circuit for generating CON and CON_B signal for the output circuit block in response to an input signal IN and EN.

* * * * *